United States Patent
Miyamoto

[11] Patent Number: 5,981,388
[45] Date of Patent: Nov. 9, 1999

[54] PLASMA CVD METHOD FOR FORMING A SEMICONDUCTOR DEVICE HAVING METAL FILM FORMED THEREBY

[75] Inventor: Takaaki Miyamoto, Kanagawa, Japan

[73] Assignee: Sony Corporation, Japan

[21] Appl. No.: 08/786,286

[22] Filed: Jan. 22, 1997

[30] Foreign Application Priority Data

Jan. 25, 1996 [JP] Japan ..................... 8-011272

[51] Int. Cl.⁶ .................................. H01L 21/44
[52] U.S. Cl. ................. 438/683; 438/485; 438/675; 438/700; 438/720; 427/552
[58] Field of Search ................. 437/245; 438/669, 438/714, 485, 488, 960, 911, 486, 487, 683, 700, 675, 72; 427/552

[56] References Cited

U.S. PATENT DOCUMENTS

| | | | |
|---|---|---|---|
| 4,980,018 | 12/1990 | Mu et al. | 156/643 |
| 5,112,650 | 5/1992 | Winter et al. | 427/255.2 |
| 5,298,458 | 3/1994 | Mieno et al. | 437/189 |
| 5,306,666 | 4/1994 | Izumi | 437/192 |
| 5,427,977 | 6/1995 | Yamada et al. | 438/960 |
| 5,563,097 | 10/1996 | Lee | 437/187 |
| 5,582,880 | 12/1996 | Mochizuki et al. | 427/569 |
| 5,861,233 | 1/1999 | Sekine et al. | 430/296 |

FOREIGN PATENT DOCUMENTS 0 583 939  2/1994  European Pat. Off. .

*Primary Examiner*—Charles Bowers
*Assistant Examiner*—Renee' R. Berry
*Attorney, Agent, or Firm*—Rader, Fishman & Grauer; Ronald P. Kananen

[57] ABSTRACT

A plasma CVD method for forming a film of a metal such as Ti on a substrate using a mixed gas including a metal-halogen compound and hydrogen with which the surface morphology of the metal film obtained is good, there is no corrosion of a conducting material layer or the like below the metal film and residual halogen in the film is low, and a semiconductor device having a metal film formed by this method. The plasma CVD method comprises employing prescribed plasma CVD conditions such that there are more activated hydrogen species present in the plasma than are consumed in the reduction of the metal-halogen compound and surplus activated hydrogen species uniformly terminate the substrate surface so that precursors produced by dissociation of the metal-halogen compound can freely migrate over the substrate and the metal film formed has a uniform thickness and good surface morphology.

10 Claims, 7 Drawing Sheets

PLASMA CVD METHOD FOR FORMING A SEMICONDUCTOR DEVICE HAVING METAL FILM FORMED THEREBY

BACKGROUND OF THE INVENTION

This invention relates to a plasma CVD method used in the manufacture of a semiconductor device and to a semiconductor device having a metal film formed by this method, and particularly to a plasma CVD method with which a metal film formed has a smooth surface morphology and the amount of residual halogen element contained in the metal is small and a highly reliable semiconductor device having a metal film formed by this method.

As design rules of semiconductor devices such as LSI devices are established to cover less dimensions reduced from half micron to quarter micron or lower levels and multilayer interconnection structures come to be used in large numbers, aspect ratios of connection holes for connecting interconnection layers together have also been becoming larger. For example, in a semiconductor device based on 0.18 $\mu$m rule, because with respect to a connection hole opening diameter of 0.2 $\mu$m the thickness of an interlayer insulating film is about 1.0 $\mu$m, the aspect ratio reaches 5. To achieve a highly reliable multilayer interconnection structure using connection holes of such small size and high aspect ratio, methods are coming to be employed wherein a metal film of Ti or the like for an ohmic contact and a TiN film or the like as a barrier metal for preventing diffusion of interconnection material are formed thinly and conformally inside the connection hole and then upper layer interconnections and contact plugs are formed by high-temperature sputtering of an Al-based metal or CVD of W.

Normally, Ti metal films and TiN films have been formed by sputtering or reactive sputtering with bulk Ti metal as the target material. Among such methods, collimated sputtering, wherein the component of perpendicularly incident sputtered particles is increased, disclosed for example in Japanese Unexamined Patent Publication No. 6-140359, and long range sputtering, wherein a long target distance is used, have been receiving particular attention. It has been confirmed that with these sputtering methods it is possible to obtain reduced contact resistance and improved barrier characteristics compared with conventional sputtering methods. However, with these sputtering methods, because the component of sputtered particles perpendicularly incident on the substrate is increased, parts where the film thickness is extremely thin are inevitably formed around the shoulders of small connection holes having large aspect ratios and around the edges of the bottoms of connection holes. In this case, when for example blanket CVD of W is carried out in a subsequent step, the process gas $WF_6$ permeates through the thin parts of the film and problems such as erosion of the base material layer, abnormal growth of W or the Ti metal film or TiN film flaking off occur.

To solve problems of step coverage not solved by these sputtering methods also including collimation and the like, methods of forming conformal Ti metal films and TiN films by CVD methods utilizing chemical reactions taking place at the substrate surface are being expected.

CVD methods for forming Ti-based material layers proposed so far can be generally classified into two types: methods using inorganic metal-halogen compounds such as $TiCl_4$, reported for example in Proceedings of the 44th Symposium on Semiconductor & Integrated Circuit Technology p.31 (1993), and methods using organic metal compounds such as TDMAT and TDEAT, reported for example in Proc. 11th Int. IEEE VMIC, p.440 (1994).

With the latter methods using organic metal source gases, in many cases a Ti metal film is formed by sputtering and then a TiN film is formed by MOCVD.

The former type of method using an inorganic metal-halogen compound source gas has the merit that it is possible to consecutively form a Ti metal film by $H_2$ reduction and a TiN film by adding $N_2$ or the like to this process gas inside the same CVD reactor.

The reaction reducing the metal-halogen compound $TiCl_4$ using $H_2$ molecules is the endothermic reaction given by the following formula (1), and thermodynamically is difficult to sustain ($\Delta G$ is standard heat of formation).

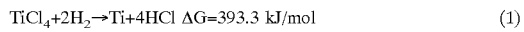

$$TiCl_4 + 2H_2 \rightarrow Ti + 4HCl \quad \Delta G = 393.3 \text{ kJ/mol} \tag{1}$$

For this reason, formation of Ti metal films by plasma CVD wherein $H_2$ is dissociated in a plasma and reduction by H atoms and activated H species is used has been receiving attention. This reaction is the exothermic reaction shown by the following formula (2).

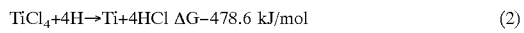

$$TiCl_4 + 4H \rightarrow Ti + 4HCl \quad \Delta G = -478.6 \text{ kJ/mol} \tag{2}$$

With this formation of a Ti metal film by plasma CVD, the reaction proceeds easily and a film can be formed at a relatively low temperature. In particular, plasma CVD reactors having a high density plasma source such as ECR-CVD reactors, inductively coupled plasma CVD reactors and helicon wave plasma CVD reactors are advantageous in film formation rate and uniformity.

However, even when plasma CVD is carried out using one of these high-density plasma CVD reactors, depending on the film-forming conditions the Ti metal film does not grow uniformly on the substrate and granular Ti metal grows nonuniformly.

This problem will be described with reference to FIGS. 1A and 1B.

These figures are schematic sectional views showing a substrate under processing having a connection hole 3 formed in an interlayer insulating film 2 on a semiconductor substrate 1 made of silicon or the like, and illustrate a problem arising when a Ti metal film 4 is formed on this by plasma CVD. That is, when the reduction of $TiCl_4$ by H atoms and activated H species is not carried out well, as shown in FIG. 1A the surface morphology of the Ti metal film 4 obtained is deteriorated by grains of nonuniformly grown Ti metal.

When a TiN film 6 is then formed on this, because as shown in FIG. 1B the TiN film 6 grows with the same surface shape as the Ti metal film 4 below it, this film also is granular, and at parts where adjacent TiN grains make contact with each other the film cannot grow any further. In particular, a large gap 7 sometimes forms at the corner of the bottom of the connection hole 3.

When in a subsequent step a layer of a refractory metal such as W is formed by CVD with $WF_6$ or the like as a process gas on a substrate on which is formed this kind of gap 7, the $WF_6$ passes through the gap 7 and erodes the semiconductor substrate 1 below and destroys shallow junctions (not shown). Also, when the connection hole 3 is filled in by an Al-based metal, the Al-based metal passes through the gap 7 and reacts with the semiconductor substrate 1 made of silicon or the like to form alloy spikes. In either case, serious defects such as increased leak current at the interlayer connection result.

Also, when the reduction of the $TiCl_4$ by H atoms and activated H species is incomplete, precursors $TiCl_x$ (where x is an integer below 4) and chlorine atoms are taken into the Ti metal film being formed, and residual chlorine in the Ti metal film increases. As a result, an Al-based metal layer or the like formed in a later step is corroded and there is a possibility of this leading to increased contact resistance and, in extreme cases, disconnection.

SUMMARY OF THE INVENTION

It is therefore an object of the present invention to provide a highly reliable plasma CVD method for forming a film of a metal such as Ti using a process gas including a metal-halogen compound such as TiCl$_4$ and hydrogen, with which method the surface of the metal film formed is smooth, residual halogen such as chlorine in the metal film is low and there is no erosion or corrosion of base material layers or interconnection material layers.

It is another object of the invention to provide a highly reliable densely integrated semiconductor device in which a metal film formed by this plasma CVD method is used for a part of an electrode or an interconnection.

To achieve these objects and other objects, the invention provides a plasma CVD method for forming a metal film on a substrate using a mixed gas including a metal-halogen compound and hydrogen comprising the step of uniformly terminating the surface of the substrate with activated hydrogen species or the step of uniformly adsorbing activated hydrogen species onto the surface of the metal film being formed on the substrate or uniformly terminating the metal film surface with activated hydrogen species while forming the metal film.

A plasma CVD condition for uniformly terminating a substrate or the surface of a metal film being formed on a substrate with activated hydrogen species or for uniformly adsorbing activated hydrogen species onto the surface of a metal film being formed on a substrate or uniformly terminating a metal film surface can be provided as follows.

That is, the plasma CVD condition of employing a mixture ratio of hydrogen in the mixed gas above a mixture ratio at which the metal film deposition rate becomes substantially saturated when the mixture ratio is gradually increased.

The upper limit on the ratio of the flow of hydrogen to the flow of the metal-halogen compound is not particularly limited, but when the flow ratio of hydrogen is set higher than necessary the metal-halogen compound is correspondingly diluted and the metal film deposition rate consequently falls. The amount of hydrogen consumed also increases unnecessarily. Therefore, the flow ratio of hydrogen with respect to the flow of the metal-halogen compound should normally be below about 100, and more practically below about 70.

In the plasma CVD method of this invention, the temperature of the substrate is preferably controlled to below 500° C. while the metal film is being formed.

Moreover, a degree of uniformly terminating the substrate surface or the metal film surface with the activated hydrogen species is detected by monitoring an intensity of at least an emission line spectrum of hydrogen atoms in the plasma.

The invention also provides a semiconductor device having a metal film formed on a substrate using the plasma CVD method described above. Namely, a semiconductor device according to the present invention comprises a substrate whose upper surface is provided with a conductive layer formed thereon, an interlayer insulating film covering the conductive layer, a connection hole provided in the interlayer insulating film so as to reach the conductive layer, and a metal film covering an inner surface of and the conductive layer at the bottom of the connection hole. At least a surface of the conductive layer at the bottom of the connection hole is uniformly terminated with activated hydrogen species, or the metal film is formed by uniformly adsorbing or uniformly terminating with the activated hydrogen species. The activated hydrogen species are included in a mixed gas of a metal-halogen compound and hydrogen used in a plasma CVD method for forming the metal film.

The metal-halogen compound used in this invention may for example be a metal-chlorine compound, a metal-bromine compound or a metal-iodine compound. More specifically, Ti-halogen compounds such as TiCl$_4$ (m.p.=−25° C., b.p.=136° C.), TiBr$_4$ (m.p.=39° C., b.p.=230° C.) and TiI$_4$ (m.p.=150° C., b.p.=377.1° C.) are preferable. Among these, TiCl$_4$ is a liquid at room temperature and is easy to handle and can therefore be particularly satisfactorily used. These halogenated titanium and organic Ti compounds can be introduced into a plasma CVD chamber by a known method such as burning or heating and bubbling using a carrier gas.

As the plasma CVD reactor employed in the plasma CVD method of the invention, although an ordinary parallel-plate plasma CVD reactor may be used, from the points of view of the film deposition rate and uniformity the use of a plasma CVD reactor having a high density plasma source, such as an ECR plasma CVD reactor, an inductively coupled plasma CVD reactor or a helicon wave plasma CVD reactor, is preferable.

The operation of the invention will now be described.

The main point of the plasma CVD method of the invention is that of employing plasma CVD conditions under which activated hydrogen species produced by dissociation of hydrogen molecules can uniformly terminate the substrate surface. By this means, precursors produced by dissociation of the metal-halogen compound easily migrate over the substrate terminated by the activated hydrogen species, and nuclei of Ti metal are uniformly formed even at the bottom of a connection hole. Thereafter a Ti metal film grows on these uniformly formed nuclei of Ti metal, but the surface of this Ti metal film also similarly uniformly adsorbs or is terminated by activated hydrogen species. Also on this Ti metal film surface having adsorbed or been terminated by activated hydrogen species, precursors produced by dissociation of the metal-halogen compound migrate actively and a uniform Ti metal film continues to grow. In this way, a Ti metal film having a uniform and smooth surface morphology can be formed.

This kind of termination by activated hydrogen species of a substrate or the surface of a growing Ti metal film is achieved by employing plasma CVD conditions such that the number of activated hydrogen species is greater than the number of precursors produced by dissociation of the metal-halogen compound. That is, when the mixture ratio of the hydrogen in the mixed gas is gradually increased, in a low range of the mixture ratio of hydrogen the Ti metal film deposition rate also gradually increases. This range can be called a hydrogen supply rate-determining range, and in this range almost all of the activated hydrogen species are consumed in reduction of the metal-halogen compound and few activated hydrogen species contribute to termination of the substrate surface.

When the mixture ratio of the hydrogen is increased further, on the other hand, the Ti metal film deposition rate reaches a saturation point beyond which the Ti metal film deposition rate does not increase even if the flow of hydrogen is increased further. In this range there are more activated hydrogen species present than are necessary for the reduction of the metal-halogen compound, and abundant surplus activated hydrogen species uniformly terminate the substrate surface.

Also, when a hydrogen mixture ratio in this range above the saturation point of the Ti metal film deposition rate is set, the amount of residual halogen element in the Ti metal film formed is reduced to below for example 1 mol %. It has been confirmed that when the amount of residual halogen element contained in the Ti metal film is less than 1 mol %, the amount of halogen element released in subsequent processes is extremely small and consequent corrosion of Al-based metal interconnections and the like is negligible.

If the temperature of the substrate during the plasma CVD is made less than 500° C., the termination by activated hydrogen species of the substrate or the surface of the growing Ti metal film becomes more certain. Also, the method can be applied not only of course to a connection hole leading to a semiconductor substrate made of silicon or the like but also forming a metal film on a substrate having a via hole leading to an Al-based metal interconnection or the like.

By using a metal film thus amply uniform and smoothed as, for example, a contact metal in interlayer connections, even in cases wherein a barrier layer consisting of a TiN film or the like is further formed on this metal film a smooth barrier layer having no gaps is formed and it is possible to provide a highly reliable semiconductor device.

DETAILED DESCRIPTION OF THE PREFERRED EMBODIMENTS

Figure 1A:
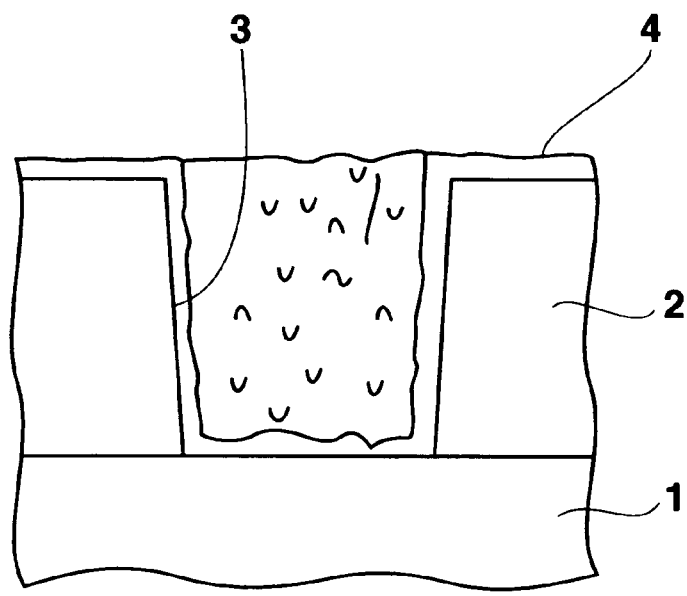
FIGS. 1A and 1B are schematic sectional views illustrating a problem in a plasma CVD method of the related art.
Figure 1B:
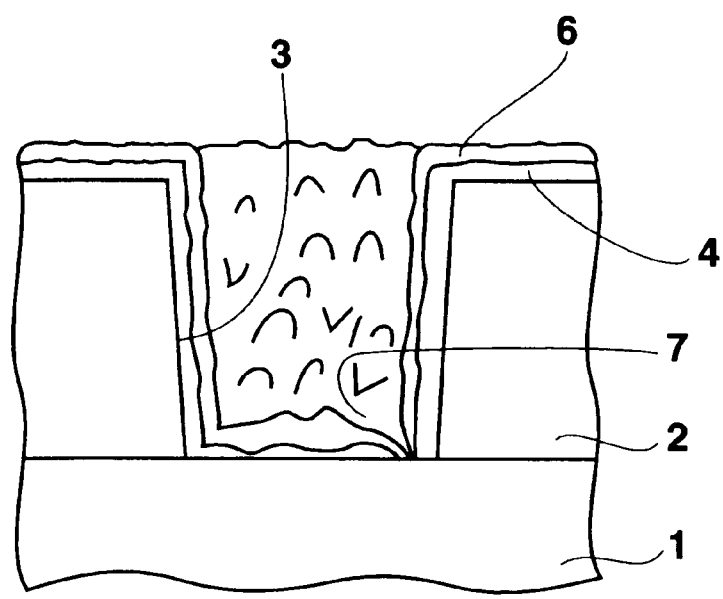

Specific preferred embodiments of the invention will now be described with reference to the accompanying drawings. These preferred embodiments are examples wherein an ECR plasma CVD reactor is employed as the plasma CVD reactor and a Ti metal film is formed using a mixed gas consisting of $TiCl_4/H_2/Ar$. In the drawings referred to hereinafter, parts the same as parts shown in FIGS. 1A and 1B showing related art have been given the same reference numerals.

First Preferred Embodiment

This preferred embodiment illustrates the principle of the invention, and will be described with reference to FIGS. 2A to 2C.

A substrate used in this preferred embodiment as an example is one made by forming an interlayer insulating film 2 consisting of $SiO_2$ to a thickness of 1.0 μm on a semiconductor substrate 1 made of silicon or the like and making a connection hole 3 of diameter 0.25 μm in this interlayer insulating film 2. After a natural oxide film on an impurity diffusion layer (not shown) exposed at the bottom of this connection hole is removed with dilute aqueous hydrofluoric acid solution, the substrate is placed on a substrate stage of an ECR plasma CVD reactor and first the bottom of the connection hole is cleaned by carrying out plasma treatment using an $H_2/Ar$ mixed gas or an $H_2/Ar/N_2$ mixed gas.

Then, inside the same ECR plasma CVD reactor, plasma CVD of a Ti layer is carried out using a mixed gas consisting of $TiCl_4/H_2/Ar$ with the following conditions:

| | | |
|---|---|---|
| $TiCl_4$ | 3 | sccm |
| $H_2$ | 100–150 | sccm |
| Ar | 20–170 | sccm |
| $H_2$ + Ar | 270 | sccm |
| Gas Pressure | 0.4 | Pa |
| Microwave Power | 2.0–2.8 | Kw (2.45GHz) |
| Substrate Stage Temp. | 380–460 | °C. |

Figure 2A:
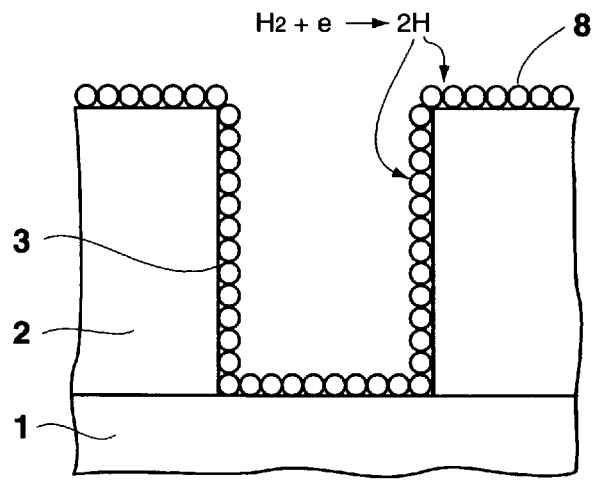
FIGS. 2A through 2C are schematic sectional views illustrating the principle of the plasma CVD method of the invention.
Figure 2B:
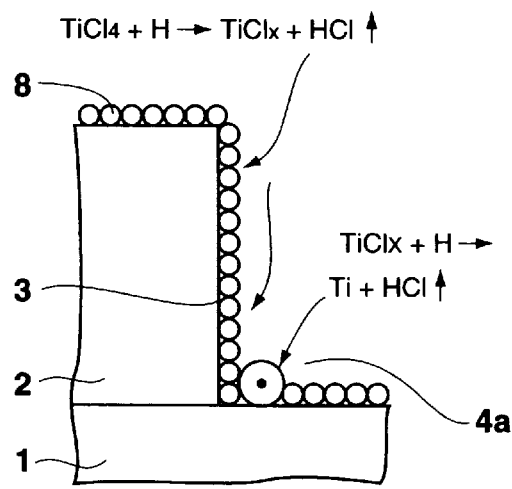
Figure 2C:
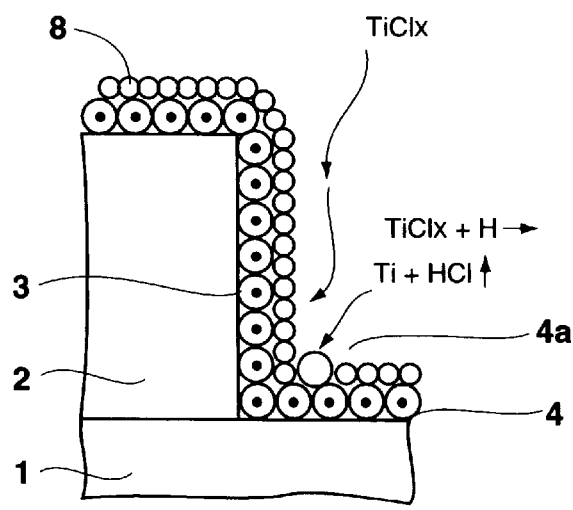

Since in these plasma CVD conditions the flow of hydrogen in the mixed gas is relatively large, activated hydrogen species produced by dissociation of $H_2$ in the plasma terminate the entire surface of the substrate, i.e. the surface of the interlayer insulating film 2, the side surfaces of the connection hole 3 and the surface of the semiconductor substrate 1 exposed at the bottom of the connection hole 3, and as shown in FIG. 2A the substrate surface is made uniform by a terminating surface of activated hydrogen species 8.

Next, precursors of the form $TiCl_x$ (where x is an integer below 4), produced by the $TiCl_4$ being excited or being reduced by activated hydrogen species in the plasma, reach the substrate surface. Because at this stage the substrate surface has already been uniformly terminated by the activated hydrogen species 8, the $TiCl_x$ can actively migrate over the substrate surface. As a result, as shown in FIG. 2B, Ti metal nuclei 4a are formed uniformly even at the bottom of the connection hole 3.

Thereafter, a Ti metal film 4 grows uniformly on these uniformly formed Ti metal nuclei 4a. In this process also, the surface of the Ti metal film 4 uniformly adsorbs or is terminated by activated hydrogen species 8. Precursors easily migrate also over the surface of this Ti metal film 4 having uniformly adsorbed or been terminated by these activated hydrogen species 8, and Ti metal nuclei 4a continue to be uniformly formed, as shown in FIG. 2C. Thereafter, the Ti metal film 4 continues to be formed in the same way with a uniform thickness and furthermore with a good surface morphology until it reaches the required thickness.

With this preferred embodiment, by using plasma CVD conditions prescribed by the invention, it is possible to form a uniform and smooth metal film consisting of Ti, in cases wherein a TiN film is formed immediately thereafter this TiN film can be formed uniformly and smoothly, there is no granularization or gap formation, and it is possible to manufacture a highly reliable semiconductor device.

Second Preferred Embodiment

This preferred embodiment is an example wherein metal films are formed by plasma CVD with the mixture ratio of hydrogen in the mixed gas being gradually increased, and this will be described with reference to FIGS. 3 through 5E.

The substrate employed in this preferred embodiment is the same as in the first preferred embodiment described above.

This substrate is set on the substrate stage of a substrate bias type ECR plasma CVD reactor, and plasma CVD of a Ti metal layer is carried out using a mixed gas consisting of $TiCl_4/H_2/Ar$ with the following plasma CVD conditions:

| | | |
|---|---|---|
| $TiCl_4$ | 3 | sccm (constant) |
| $H_2$ | 0–180 | sccm (variable) |
| $H_2$ + Ar | 270 | sccm (constant) |
| Gas Pressure | 0.4 | Pa |
| Microwave Power | 2.8 | Kw (2.45GHz) |
| Substrate Stage Temp. | 460 | °C. |

Figure 3:
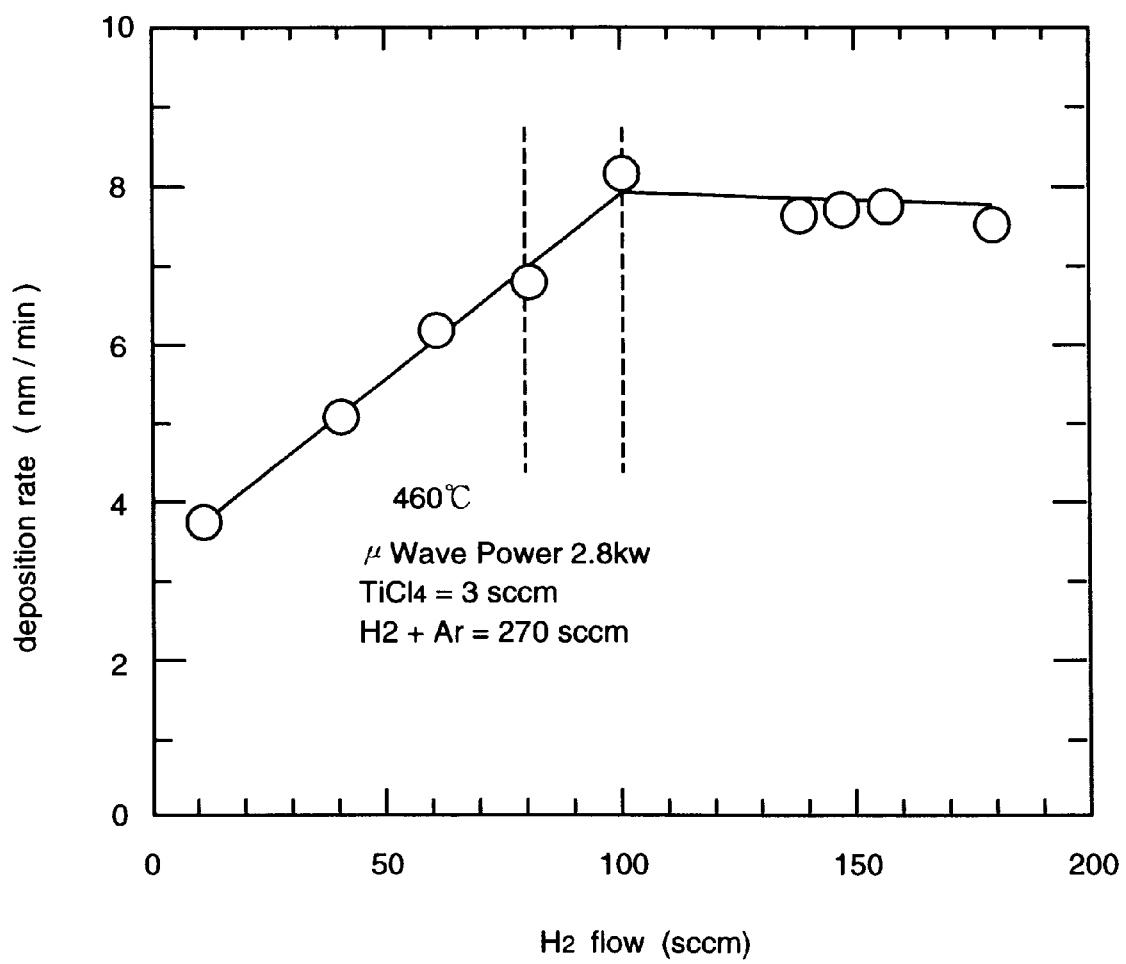
FIG. 3 is a graph showing hydrogen flow in a mixed CVD process gas vs. metal film deposition rate in a second preferred embodiment of the invention.

Ti metal film deposition rates obtained when the $H_2$ flow was gradually increased under these plasma CVD conditions are shown in FIG. 3. At this time, the flow of Ar was gradually decreased so that the total flow of $H_2$+Ar remained constant. As is clear from FIG. 3, the Ti metal film deposition rate becomes substantially saturated at an $H_2$ flow between 80 and 100 sccm. At $H_2$ flows less than this, activated hydrogen species in the plasma are immediately consumed in the reduction of $TiCl_4$ and there is constantly a shortage of activated hydrogen species. Therefore, the substrate surface is not uniformly terminated by activated hydrogen species.

From when the hydrogen flow reaches about 80 sccm, on the other hand, the Ti metal film deposition rate becomes saturated. In this range, remaining activated hydrogen species not consumed in the reduction of $TiCl_4$ are present in abundance in the plasma, and the substrate surface is uniformly terminated by these activated hydrogen species. The surface of the Ti metal film forming on the substrate also similarly uniformly adsorbs or is terminated by activated hydrogen species.

The substrate surface being uniformly terminated by activated hydrogen species can also be detected by monitoring changes in the emission spectrum intensity of the plasma. That is, when a plasma is generated with different $H_2$ flows and a fixed flow of $TiCl_4$ is mixed with this $H_2$, the intensity of the emission line spectrum of the hydrogen atoms decreases with an increase in the $H_2$ flow, and it can be considered that the substrate surface has been uniformly terminated by activated hydrogen species in the vicinity of a point at which there is a sudden fall in the decrease factor D by which the intensity of this emission line spectrum of hydrogen atoms decreases, given by the following equation:

$$D=(I_0-I)/I_0,$$

where $I_0$ is the intensity of the emission line spectrum of the hydrogen atoms before the metal-halogen compound is mixed with the $H_2$ and I is the emission line spectrum of the hydrogen atoms after the metal-halogen compound is mixed in.

Figure 4A:
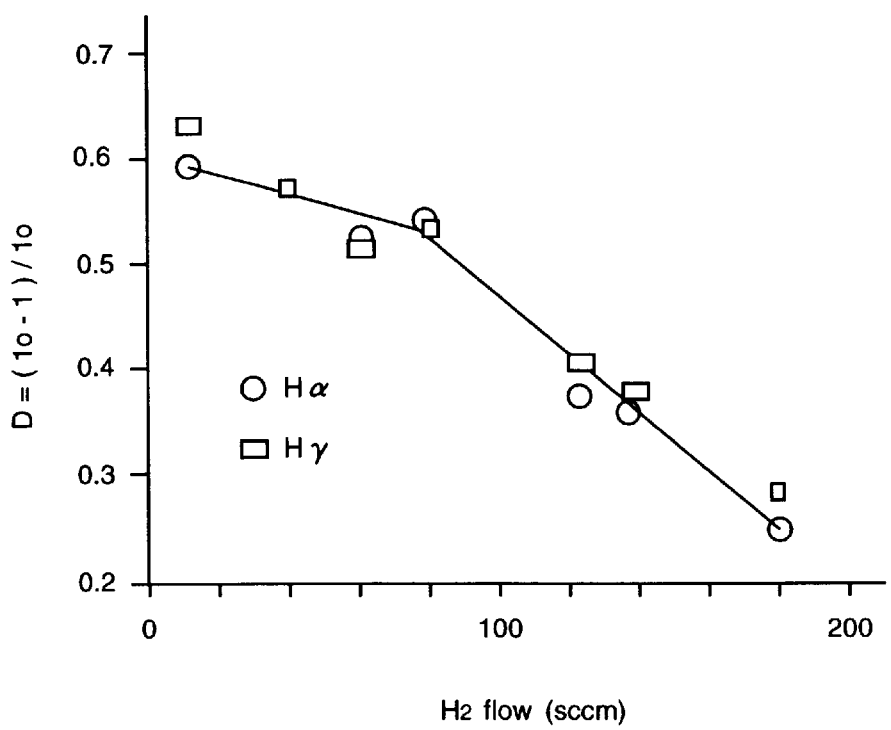
FIGS. 4A and 4B are graphs showing relationships between $H_2$ flow and hydrogen emission spectrum intensity decrease factor D in the second preferred embodiment.
Figure 4B:
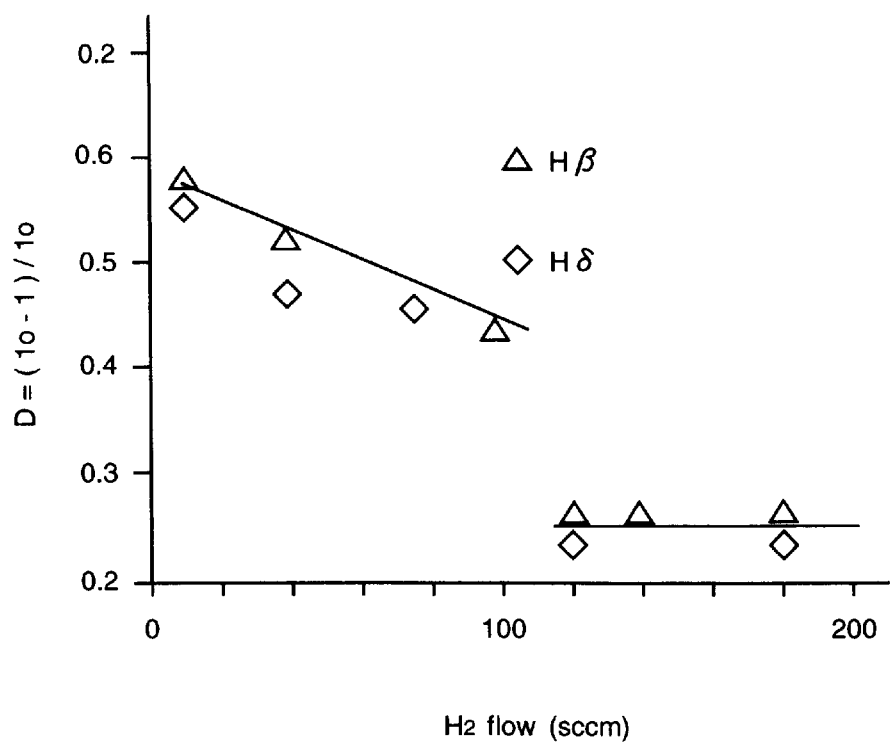

Decrease factors D expressed by the above equation by which the intensity of the emission line spectrum of the hydrogen atoms decreased when the $TiCl_4$ was mixed with the $H_2$ are shown in FIGS. 4A and 4B for $H_2$ flows gradually increasing from 10 sccm to 180 sccm. FIG. 4A shows decrease factors of emission spectrum intensities of $H_\alpha$ line (656.3 nm) and Hy line (434.0 nm), and FIG. 4B shows decrease factors of emission spectrum intensities of $H_\beta$ line (486.1 nm) and $H_\delta$ line (410.2 nm). The plasma CVD conditions were the same as those mentioned above in this preferred embodiment.

As is clear from FIGS. 4A and 4B, as the $H_2$ flow increases the decrease factors D of all the emission line spectra intensities of hydrogen atoms decrease, and when the $H_2$ flow passes the vicinity of 80 sccm to 100 sccm the rate of decrease of the D value suddenly changes. At $H_2$ flows above this point of change, there are many more H atoms and activated H species present than the number consumed in the reaction by which the $TiCl_4$ is reduced, and abundant remaining activated hydrogen species uniformly terminate the substrate surface. In this range, the D value is small. Looking at FIG. 4B in particular, the D values of the $H_\beta$ line and $H_\delta$ line emission spectra, of which the excitation energy is large, show substantially constant values at $H_2$ flows above about 100 sccm. This indicates that the $TiCl_4$ reduction reaction is not a reaction rate-determined by the supply of H atoms and activated H species and is rate-determined at the substrate surface and that these activated species having a large activation energy are playing an important role in the reduction reaction.

States of Ti metal films formed in and around a connection hole of a substrate corresponding to different $H_2$ flows gradually increased from 0 sccm to 100 sccm are shown in FIGS. 5A through 5E. The respective $H_2$ flow is 100 sccm in FIG. 5A, 80 sccm in FIG. 5B, 60 sccm in FIG. 5C, 10 sccm in FIG. 5D and 0 sccm in FIG. 5E.

Figure 5A:
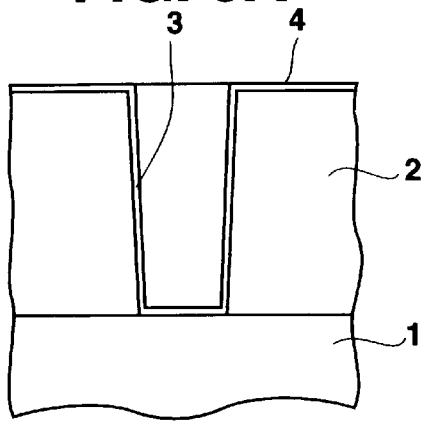
FIGS. 5A through 5E are schematic sectional views showing states of formation of a metal film in and around a connection hole on a substrate in the second preferred embodiment.

As is clear from these figures, when the $H_2$ flow was 100 sccm, a Ti metal film 4 having a smooth surface was formed extremely uniformly not only on the top of the interlayer insulating film 2 but also inside the connection hole 3 (FIG. 5A). This result is also obtained when the $H_2$ flow exceeds 100 sccm.

Figure 5B:
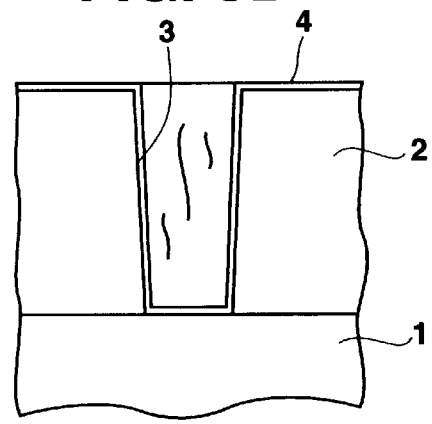

Also in the case of the substrate shown in FIG. 5B with which the $H_2$ flow was 80 sccm, the only shortcoming was that very slight surface roughening was observed on the Ti metal film 4 surface, and a Ti metal film 4 of a quality amply sufficient to function as a highly reliable contact metal was formed. The substrates of FIGS. 5A and 5B were both processed under plasma CVD conditions wherein the Ti metal film deposition rate shown in the graph of FIG. 3 had substantially reached saturation, and the substrate surface or the surface of the Ti metal film being formed uniformly was terminated by or adsorbed activated hydrogen species. Also, the amount of chlorine contained in the Ti metal film 4 formed under these plasma CVD conditions was less than 1 mol % in both cases.

Figure 5C:
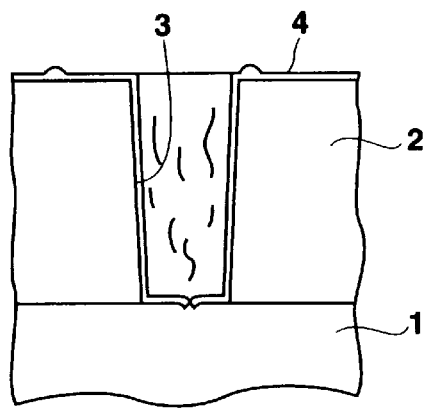
Figure 5D:
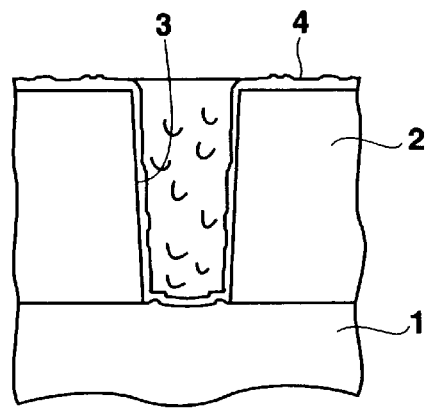
Figure 5E:
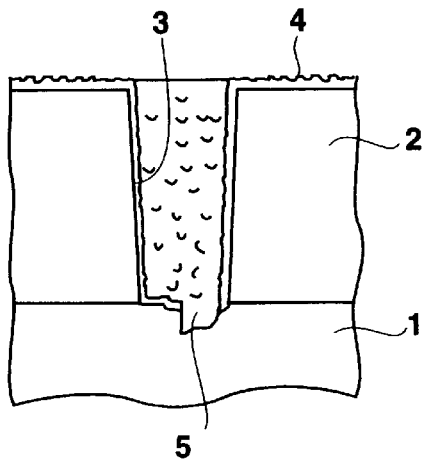

With $H_2$ flows of 60 sccm or less, on the other hand, there is a shortage of hydrogen and the supply of activated hydrogen species is insufficient. Consequently, the substrate surface is not uniformly terminated by activated hydrogen species, and part or all of the substrate surface remains exposed. In this case, the migration of precursors consisting of $TiCl_x$ is dull and Ti metal nuclei are not formed uniformly. Because growth of the Ti metal film 4 then proceeds centering on these uneven Ti metal nuclei, the Ti metal film 4 formed is granular and its surface morphology is poor (FIGS. 5C to 5E). Also, because the reduction of the $TiCl_4$ by activated hydrogen species is insufficient, exposed parts of the silicon semiconductor substrate 1 are etched and corroded parts 5 form. These plasma CVD conditions are such that the Ti metal film deposition rate shown in the graph of FIG. 3 is below the point at which it becomes substantially saturated, and the substrate surface or the surface of the Ti metal film being formed was not uniformly terminated by nor adsorbed activated hydrogen species. Also, the amount of chlorine contained in the Ti metal film 4 formed under these plasma CVD conditions exceeded 1 mol % in both cases.

With this preferred embodiment it is possible to clarify the optimum mixture ratio of hydrogen in the mixed gas, and plasma CVD of a metal layer having good surface morphology which is smooth and also has a low chlorine content is possible. The absolute value of the optimum mixture ratio of hydrogen in the mixed gas is influenced by apparatus factors of the plasma CVD reactor and so on, and consequently it is not rational to prescribe plasma CVD conditions indiscriminately using absolute mixture ratio values. Therefore, to manufacture highly reliable metal films and semiconductor devices it is important to ascertain the relationship between hydrogen flow and deposition rate shown in FIG. 2 for the individual plasma CVD reactor to be used and employ plasma CVD conditions such that the deposition rate is saturated.

Third Preferred Embodiment

This preferred embodiment is an example wherein in the reverse of the second preferred embodiment described above metal films are formed by plasma CVD with the hydrogen flow being kept constant and the flow of the metal-halogen compound being changed. This will be described with reference to FIGS. 6A through 7B.

The substrate employed in this preferred embodiment is the same as in the first preferred embodiment described above.

This substrate is set on the substrate stage of a substrate bias impression type ECR plasma CVD reactor, and plasma CVD of a Ti metal layer is carried out using a mixed gas consisting of $TiCl_4/H_2/Ar$ with the following plasma CVD conditions:

| | | |
|---|---|---|
| $TiCl_4$ | 3-30 | sccm (variable) |
| $H_2$ | 100 | sccm (constant) |
| Ar | 170 | sccm (constant) |
| Gas Pressure | 0.4 | Pa |
| Microwave Power | 2.8 | Kw (2.45GHz) |
| Substrate Stage Temp. | 460 | °C. |

States of a Ti metal film 4 formed in and around a connection hole 3 of a substrate corresponding to different $TiCl_4$ flows gradually increased from 3 sccm to 30 sccm are shown in FIGS. 6A through 6D. The respective $TiCl_4$ flow is 3 sccm in FIG. 6A, 5 sccm in FIG. 6B, 10 sccm in FIG. 6C and 30 sccm in FIG. 6D.

Figure 6A:
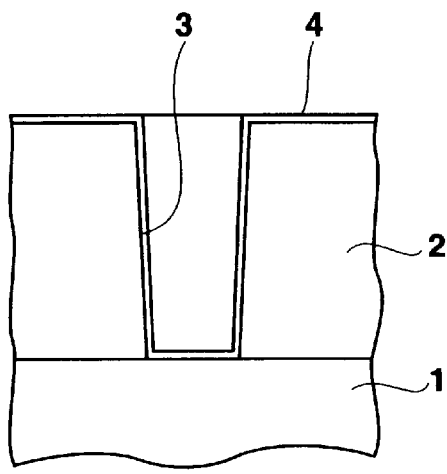
FIGS. 6A through 6D are schematic sectional views showing states of formation of a metal film in and around a connection hole on a substrate in a third preferred embodiment.
Figure 6B:
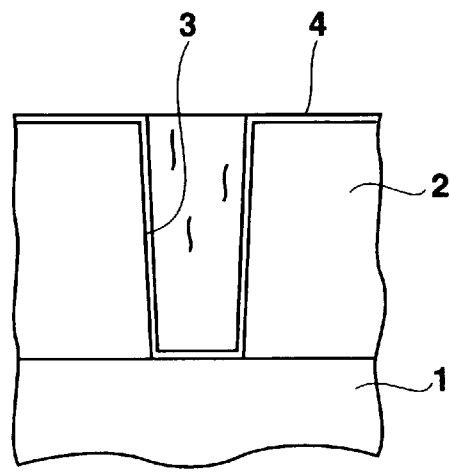

As is clear from these figures, when the $TiCl_4$ flow was 3 sccm, a Ti metal film 4 having a smooth surface was formed extremely uniformly not only on the top of the interlayer insulating film 2 but also inside the connection hole 3 (FIG. 6A). Also in the case wherein the $TiCl_4$ flow was 5 sccm, the only shortcoming was that very slight surface roughening was observed on the Ti metal film 4 surface, and the Ti metal film 4 was of a quality amply sufficient to function as a highly reliable contact metal (FIG. 6B).

These plasma CVD conditions are such that the substrate surface or the surface of the Ti metal film being formed uniformly was terminated by or adsorbed activated hydrogen species. Also, the amount of chlorine contained in the Ti metal film 4 formed with these plasma CVD conditions was less than 1 mol % in both cases.

Figure 6C:
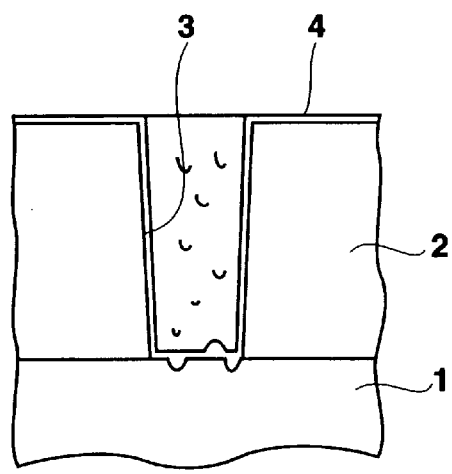
Figure 6D:
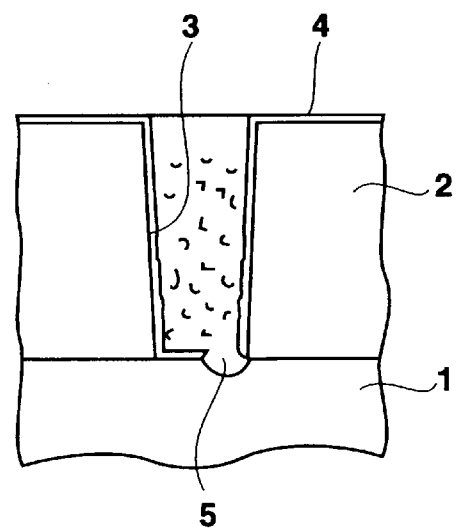

With plasma CVD conditions wherein the $TiCl_4$ flow is 10 sccm or more, on the other hand, there is a shortage of hydrogen and the supply of activated hydrogen species is insufficient. Consequently, the substrate surface is not uniformly terminated by activated hydrogen species, and part or all of the substrate surface remains exposed. In this case, the migration of precursors consisting of $TiCl_x$ is dull and Ti metal nuclei are not formed uniformly. Because growth of the Ti metal film 4 then proceeds centering on these non-uniform Ti metal nuclei, the Ti metal film 4 formed is granular and its surface morphology is poor (FIGS. 6C to 6D). Also, because the reduction of the $TiCl_4$ by activated hydrogen species is insufficient, exposed parts of the silicon semiconductor substrate 1 are etched and corroded parts 5 form. These plasma CVD conditions are such that the substrate surface or the surface of the Ti metal film being formed is not terminated by nor adsorbs activated hydrogen species uniformly. Also, the amount of chlorine contained in the Ti metal film 4 formed with these plasma CVD conditions exceeded 1 mol % in both cases.

In this preferred embodiment also, it is possible to detect the substrate surface being uniformly terminated by activated hydrogen species by monitoring changes in the emission spectrum intensity of the plasma. This will be explained with reference to FIGS. 7A and 7B.

Figure 7A:
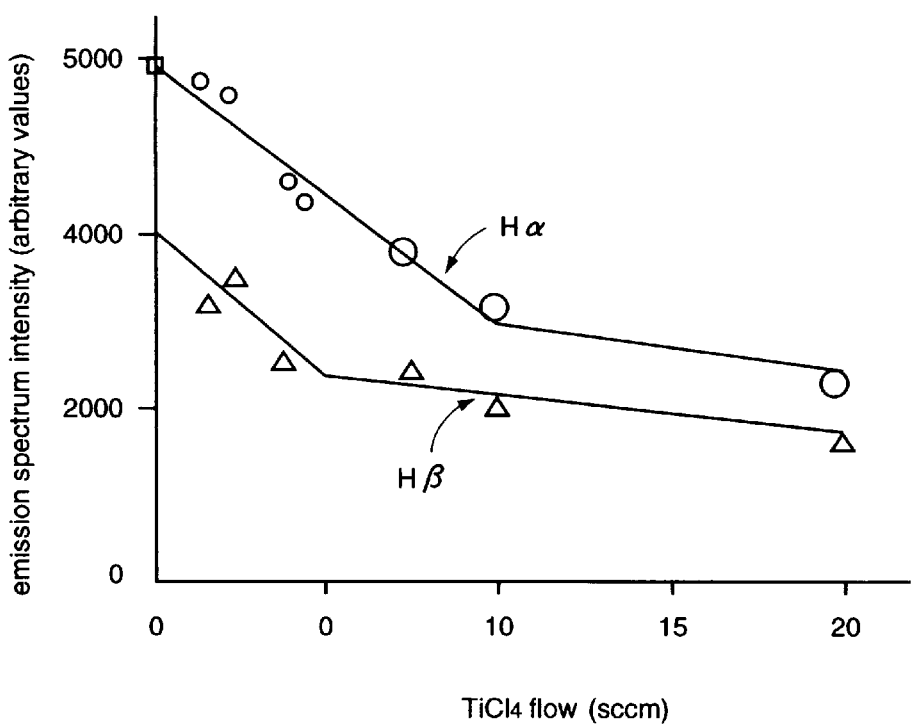
FIGS. 7A and 7B are graphs showing relationships between $TiCl_4$ flow and hydrogen and chlorine emission spectrum intensity in the third preferred embodiment.
Figure 7B:
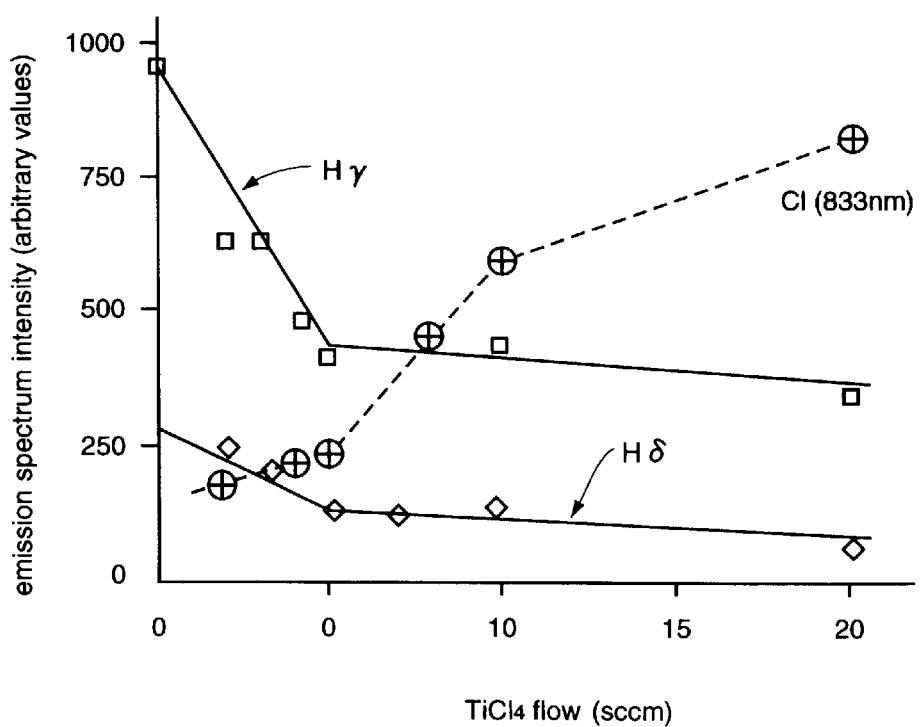

Emission spectrum intensities of hydrogen atoms and emission spectrum intensities of chlorine in the plasma when the $TiCl_4$ flow is gradually increased from 0 sccm to 20 sccm are shown in FIGS. 7A and 7B. The plasma CVD conditions were the same as those mentioned above in this preferred embodiment. FIG. 7A shows the emission intensities of the $H_\alpha$ line and the $H_\beta$ line of the hydrogen atom emission spectrum and FIG. 7B shows those of the $H_\gamma$ line and the $H_\delta$ line of the hydrogen atom emission spectrum and that at 833 nm, which is the emission spectrum of chlorine.

As is clear from these figures, although the emission intensities of the $H_\beta$ line, the $H_\gamma$ line and the $H_\delta$ line monotonically decrease as the mixture ratio of the $TiCl_4$ increases, the rate of this decrease changes suddenly and becomes gentle when the $TiCl_4$ flow passes about 5 sccm. That is, when the $TiCl_4$ flow is below about 5 sccm, more H atoms and activated H species are present in the plasma than are consumed in the reduction of the $TiCl_4$ and the substrate surface is uniformly terminated by activated hydrogen species. When on the other hand the flow of $TiCl_4$ is above 5 sccm, the H atoms and activated H species present in the plasma are almost all consumed in the reduction of $TiCl_4$ and are constantly in short supply consequently the substrate is not terminated by activated hydrogen species.

Looking at the emission spectrum intensity of chlorine shown in FIG. 7B, although at low $TiCl_4$ flows this emission intensity monotomically increases as the $TiCl_4$ flow increases, the rate of this increase suddenly changes when the $TiCl_4$ flow passes 5 sccm. That is, it is clear that when the $TiCl_4$ flow is below about 5 sccm, reduction of the $TiCl_4$ by H atoms and activated H species present in the plasma $TiCl_4$ proceeds fully, and that when the mixture ratio of the $TiCl_4$ is over 5 sccm there is surplus $TiCl_4$ in the plasma which is not reduced. Also, the fact that an inverse correlation can be found between the emission intensity changes of the $H_\beta$ line, the $H_\gamma$ line and the $H_\delta$ line and the emission spectrum intensity change of the chlorine indicates that in the plasma CVD reaction based on the reduction of $TiCl_4$ by $H_2$ it is the hydrogen atoms having high excitation energy that are contributing to the reduction reaction.

In this preferred embodiment also, it becomes possible to clarify the optimum mixture ratio of hydrogen with respect to the metal-halogen compound, and plasma CVD for forming a metal layer having good surface morphology which is smooth and also has a low chlorine content becomes possible.

The plasma CVD method of the invention and the semiconductor device having a metal film formed thereby have been described above with reference to three preferred embodiments, but the invention is not limited to these preferred embodiments and various other modes of practicing the invention are possible. For example, although TiCl$_4$ was used as an example of a metal-halogen compound, any of the other halogenated titanium compounds mentioned above can alternatively be used. It should also be clear that the technological concept of invention is not limited to halogenated titanium and can be applied to the formation of metal films by plasma CVD using various other metal-halogen compounds.

As the substrate on which the metal film is formed, a silicon substrate having a connection hole leading to a diffusion layer was shown as an example, but a semiconductor substrate having a via hole leading to an Al-based metal interconnection or an interconnection layer of polysilicon or the like or another object of processing may be used.

As the plasma CVD reactor an ECR plasma CVD reactor was used, but the effects of the invention can be obtained in a reactor of any type, such as a parallel-plate plasma CVD reactor, a helicon wave plasma CVD reactor, an ICP (Inductively Coupled Plasma) CVD reactor or a TCP (Transformer Coupled Plasma) CVD reactor. Also, if a light-assisted plasma CVD method is employed wherein simultaneously with the plasma an exciting light beam from a low pressure Hg lamp or an excimer laser or the like is used, a reaction having even better reduction efficiency can be utilized.

As is clear from the above description, with the plasma CVD method of this invention, it becomes possible to form a metal film with excellent surface morphology and step coverage without corrosion of a silicon substrate or the like. Together with this, reduction of residual halogen content of the metal film is possible.

Also, by using such a metal film as an electrode or interconnection material of a highly densely integrated semiconductor device, it is possible to provide a highly reliable semiconductor device with no interconnection corrosion or the like.

What is claimed is:

1. A plasma CVD method for forming a metal film on a substrate using a mixed gas including a metal-halogen compound and hydrogen comprising:

the step of uniformly terminating the surface of said substrate with activated hydrogen species while forming said metal film using said mixed gas.

2. A plasma CVD method according to claim 1, wherein said step of uniformly terminating said substrate surface is carried out with a mixture ratio of said hydrogen in said mixed gas being made equal to or more than a mixture ratio at which the metal film deposition rate becomes substantially saturated when said mixture ratio is gradually increased.

3. A plasma CVD method according to claim 1, wherein the temperature of said substrate is controlled to below 500° C. while said metal film is being formed.

4. A plasma CVD method for forming a metal film on a substrate comprising:

the step of uniformly adsorbing activated hydrogen species onto the surface of each of said substrate and said metal film being formed directly on said substrate, or uniformly terminating each of said metal film surface and said substrate with said activated hydrogen species while forming said metal film, using a mixed gas including a metal-halogen compound and hydrogen gas.

5. A plasma CVD method according to claim 4, wherein said step of uniformly adsorbing or uniformly terminating is carried out with a mixture ratio of said hydrogen in said mixed gas being made equal to or more than a mixture ratio at which the metal film deposition rate becomes substantially saturated when said mixture ratio is gradually increased.

6. A plasma CVD method according to claim 4, wherein the temperature of said substrate is controlled to below 500° C. while said metal film is being formed.

7. A plasma CVD method according to claim 1, wherein a degree of uniformly terminating said substrate surface with said activated hydrogen species is detected by monitoring an intensity of at least an emission line spectrum of hydrogen atoms in the plasma.

8. A plasma CVD method according to claim 4, wherein a degree of uniformly terminating said metal film surface with said activated hydrogen species is detected by monitoring an intensity of at least emission line spectrum of hydrogen atoms in the plasma.

9. A plasma CVD method for forming a metal film on a substrate using a mixed gas including a metal-halogen compound and hydrogen comprising:

the step of uniformly terminating the entire surface of said substrate with activated hydrogen species while forming said metal film using said mixed gas, and uniformly adsorbing activated hydrogen species onto the surface of said metal film being formed directly on said substrate or uniformly terminating said metal film surface with said activated hydrogen species while forming said metal film.

10. A plasma CVD method for forming a metal film on a substrate using a mixed gas including a metal-halogen compound and hydrogen comprising:

the step of uniformly terminating the surface of said substrate with activated hydrogen species while forming said metal film using said mixed gas, and uniformly adsorbing activated hydrogen species onto the surface of said metal film being formed directly on said substrate or uniformly terminating said metal film surface with said activated hydrogen species while forming said metal film, wherein a degree of uniformly terminating said substrate surface with said activated hydrogen species is detected by monitoring an intensity of at least an emission line spectrum of hydrogen atoms in the plasma.

* * * * *